(12) United States Patent
Ragaini et al.

(10) Patent No.: US 10,352,985 B2
(45) Date of Patent: Jul. 16, 2019

(54) METHOD FOR DETECTING GROUND FAULTS IN A LVDC ELECTRIC LINE AND AN ELECTRONIC DEVICE THEREOF

(71) Applicant: ABB S.P.A., Milan (IT)

(72) Inventors: Enrico Ragaini, Bergamo (IT); Marco Carminati, Bergamo (IT)

(73) Assignee: ABB S.P.A., Milan (IT)

( * ) Notice: Subject to any disclaimer, the term of this patent is extended or adjusted under 35 U.S.C. 154(b) by 280 days.

(21) Appl. No.: 15/228,404

(22) Filed: Aug. 4, 2016

(65) Prior Publication Data

US 2017/0038423 A1    Feb. 9, 2017

(30) Foreign Application Priority Data

Aug. 5, 2015 (EP) .................................... 15179858

(51) Int. Cl.
*G01R 31/02* (2006.01)
*G01R 31/08* (2006.01)
(Continued)

(52) U.S. Cl.
CPC .......... *G01R 31/086* (2013.01); *G01R 31/025* (2013.01); *H01F 38/40* (2013.01); *H02H 1/0007* (2013.01); *H02M 7/04* (2013.01)

(58) Field of Classification Search
CPC ..... G01R 31/086; G01R 31/025; H01F 38/40; H02H 1/0007; H02M 7/04
See application file for complete search history.

(56) References Cited

U.S. PATENT DOCUMENTS 3,978,465 A * 8/1976 Goode .................. G01R 27/18
340/651
5,675,465 A * 10/1997 Tanaka .................. G01R 31/346
361/20
(Continued)

FOREIGN PATENT DOCUMENTS

CN      106443320 A  *  2/2017  ........... G01R 31/086
EP        3128335 A1  *  2/2017  ........... G01R 31/086

OTHER PUBLICATIONS

Jose' A. Marreo. Understand Ground Fault Detection & Isolation in DC Systems. IEEE. 2000. (Year: 2000).*
(Continued)

*Primary Examiner* — Patrick Assouad
*Assistant Examiner* — Sean Curtis
(74) *Attorney, Agent, or Firm* — Polsinelli PC

(57) ABSTRACT

The invention relates to a method (100) for detecting faults in a LVDC electric line (500) characterized in that it comprises the following steps:

acquiring (101) a first detection signal ($V_{LOW}$) indicative of low-frequency components of an unbalancing current ($I_G$) between a plurality of conductors of said electric line, said first detection signal being obtained by means of a low-pass filtering of a corresponding measuring signal ($V_{M1}$) indicative of said unbalancing current;

acquiring (102) a second detection signal ($V_{HIGH}$) indicative of high-frequency components of an unbalancing current ($I_G$) between a plurality of conductors of said electric line, said second detection signal being obtained by means of a high-pass filtering of a corresponding measuring signal ($V_{M2}$) indicative of said unbalancing current;

obtaining (103) a third detection signal (RT) by calculating the ratio between said first and second detection signals ($V_{LOW}$, $V_{HIGH}$);

(Continued)

checking (104) whether a DC current ($I_F$) is present by comparing said third detection signal (RT) with a first threshold value (TH1).

In a further aspect, the invention relates to an electronic device (1) including processing means for carrying out said method.

22 Claims, 8 Drawing Sheets

(51) Int. Cl.
  *H01F 38/40* (2006.01)
  *H02H 1/00* (2006.01)
  *H02M 7/04* (2006.01)

(56) References Cited

U.S. PATENT DOCUMENTS

| | | | | |
|---|---|---|---|---|
| 5,764,462 | A * | 6/1998 | Tanaka | G01R 31/346 |
| | | | | 324/509 |
| 6,144,721 | A * | 11/2000 | Stephens | H04M 1/24 |
| | | | | 324/520 |
| 6,809,579 | B2 * | 10/2004 | Vandewege | H02M 1/32 |
| | | | | 327/544 |
| 7,233,464 | B2 * | 6/2007 | Rice | H02H 3/28 |
| | | | | 324/130 |
| 7,626,396 | B2 * | 12/2009 | Lindsey | B60L 3/0023 |
| | | | | 324/509 |
| 8,810,979 | B2 * | 8/2014 | Kinsel | H02H 3/355 |
| | | | | 361/42 |
| 9,651,580 | B2 * | 5/2017 | Ghezzi | G01R 15/183 |
| 9,823,289 | B2 * | 11/2017 | Pal | G01R 31/025 |
| 2005/0067900 | A1 * | 3/2005 | Bailey | B60L 53/14 |
| | | | | 307/45 |
| 2014/0239968 | A1 * | 8/2014 | Ishii | H01L 31/02021 |
| | | | | 324/509 |
| 2016/0349305 | A1 * | 12/2016 | Pal | G01R 31/025 |
| 2017/0038423 | A1 * | 2/2017 | Ragaini | G01R 31/086 |
| 2018/0022218 | A1 * | 1/2018 | Watanuki | B60L 3/0069 |
| | | | | 324/503 |
| 2018/0375387 | A1 * | 12/2018 | Oshima | H02J 50/70 |
| 2019/0013691 | A1 * | 1/2019 | Oshima | H02J 7/027 |

OTHER PUBLICATIONS

Han et al., A Study on the Fault Characteristics of Line Fault in LVDC Distribution System, 2014. (Year: 2014).*

Xue et al., Line-to-Line Fault Analysis and Location in a VSC-Based Low-Voltage DC Distribution Network, Energies 2018, 11, 536. (Year: 2018).*

Shabani et al., Studying grounding arrangements of the LVDC system through simulation. Simulation: Transactions of the Society for Modeling and Simulation International 2018, vol. 94(5) 441-449 (Year: 2018).*

Jose1 A. Marreo. Understand Ground Fault Detection & Isolation in DC Systems. IEEE. 2000. (Year: 2000).*

Han et al., A Study on the Fault Characteristics of Line Fault in LVDC Distribution System, 2014. (Year: 2014).*

Carminati et al., DC and AC ground fault analysis in LVDC microgrids with energy storage systems . IEEE 2000. (Year: 2000).*

Zaman et al., Development of Protective Method based on Superposition Principle along with Fault Current Limiter in Low VoltageDC Distribution System, International Conference on Power Systems Transients (IPST2017) in Seoul, Republic of Korea Jun. 26-29, 2017 (Year: 2017).*

Xue et al., Line-to-Line Fault Analysis and Location in a VSC-Based Low-Voltage DC Distribution Network, Energies 2018, 11,536. (Year: 2018).*

Dong et al., "How-Frequency leakage current reduction using active control of single-phase PWN rectifier", Energy Conversion Congress and Exposition, Sep. 17, 2011, pp. 3778-3785.

Nuutinen et al., "On Common-Mode and RF EMI in a Low-Voltage DC Distribution Network", IEEE Transaction on Smart Grid, vol. 5, No. 5, Sep. 1, 2014, pp. 2583-2592.

Rekola et al., "Effect of Network Configuration and Load Profile on Efficiency of LVDC Distribution Network", 2014 16$^{th}$ European Conference on Power Electronics and Applications, Aug. 26, 2014, pp. 1-10.

Extended European Search Report dated Feb. 22, 2016 in EP Appln 15179858.4.

* cited by examiner

METHOD FOR DETECTING GROUND FAULTS IN A LVDC ELECTRIC LINE AND AN ELECTRONIC DEVICE THEREOF

CROSS REFERENCE TO RELATED APPLICATIONS

This application is claims priority to application Ser. No. 15/179,858.4, filed in Europe on Aug. 5, 2015 under 35 U.S.C. § 119. The entire contents of this application are hereby incorporated by reference.

BACKGROUND OF THE INVENTION

1. Field of the Invention

The present invention relates to to the field of LVDC electric power distribution networks. More particularly, the present invention relates to a method and an electronic device for detecting ground faults in a LVDC electric power distribution network.

2. Background Information

For the sake of clarity, the following is specified:
the term "low voltage" (LV) relates to voltages lower than 1 kV AC and 1.5 kV DC;
the term "medium voltage" (MV) relates to voltages higher than 1 kV AC and 1.5 kV DC up to some tens of kV, e.g. up to 72 kV AC and 100 kV DC;
the terms "LVDC electric power distribution network" and "LVDC electric line" respectively identify a LV electric power distribution network and a LV electric line, in which DC currents flow.

As is known, the electricity distribution scenario has changed in the last years. Good power quality and electricity distribution efficiency have become very important factors in the management of electricity distribution, as customers are now basically dependent on an uninterrupted power supply and the price of energy is continuously rising.

Further, the wide diffusion of DG (Distributed Generation) systems (e.g. solar panel systems, wind generation systems and the like) and energy storage systems (e.g. batteries, super-capacitors and the like) in electric power distribution grids has posed new network management issues to be faced.

Low voltage direct current (LVDC) electric power distribution networks have thus become increasingly interesting for electricity distribution, as they have remarkable advantages with respect to tradition electric power distribution grids.

LVDC electric power distribution networks are generally characterized by higher efficiency and capacity in electricity transmission, as resistive losses are normally lower and all the transmitted power is substantially active power.

Further, they typically ensure a higher power quality to the customers, as it is normally easier to provide for compensation of voltage sags and short interruptions of the feeding MV electric power distribution network.

In addition, they allow an easy connection (using a relatively small number of conversion stages and without need of phase synchronization) with DG systems and energy storage systems.

In LVDC electric power distribution networks, protection against ground faults is provided by switching devices (e.g. circuit breakers) incorporating or operatively associated with suitable protection devices.

Such protection devices are typically configured to detect the presence of an unbalancing current $I_G$ between the conductors of an electric line associated thereof, as this may be indicative of occurring fault conditions.

The experience has shown how currently available protection devices may not ensure an optimal management of a LVDC electric power distribution network.

In FIGS. 1A, 1B, 1C the operation of a generic electric line 1002 of a LVDC electric power distribution network 1000 is shown.

As is known, a LVDC electric power distribution network 1000 is typically fed by a feeding stage 1001, which includes a power transformer and AC/DC converter and which is electrically coupled with an AC feeding network 1005.

During normal operation, leakage currents $I_{LK}$ may be generated by the AC/DC converter of the feeding stage 1001. Typically, said leakage currents $I_{LK}$ flow towards ground through an electric path formed by the ground connection of the power transformer, the AC/DC converter, the conductors of the electric line 1002, which feeds an electric load 1003, and the ground coupling capacitances $C_P$ (FIG. 1B).

Leakage currents $I_{LK}$ have a relatively high frequency, which basically corresponds to the switching frequency of the converter (e.g. 10 KHz) and multiple frequencies thereof. When a ground fault occurs at the electric line 1002, a DC fault current $I_F$ flows toward ground through an electric path formed by the ground connection of the converter 1001, the converter 1001 itself, the conductors of the electric line 1002 and the fault resistance to ground $R_G$ (FIG. 1C).

In view of the above, it is evident that the DC fault current $I_F$ and the leakage currents $I_{LK}$ follow common electric paths towards grounds, which include the conductors of the electric line 1002.

Therefore, when an unbalancing (current towards ground) current $I_G$ is detected between the conductors of the electric line 1002, such a current may be due to the sole leakage currents $I_{LK}$ or it may be due also to the presence of a DC current $I_F$ indicative of a ground fault event.

An example of behaviour of a detected unbalancing current $I_G$ between the conductors of the electric line is shown in FIG. 1A. In this case, it is possible to notice the overlapping of a DC current $I_F$ (due to a ground fault event) and high frequency components $I_{LK}$ (due to leakage currents towards ground).

Unfortunately, the protection devices commonly adopted in LVDC electric power distribution networks are configured to merely check whether a detected unbalancing current $I_G$ in an electric line overcomes a given threshold value.

As it may be easily understood, these poor discrimination capabilities may lead to wrong protection interventions, particularly when relatively high leakage currents $I_{LK}$ towards ground are present.

The electric line 1002 may thus be interrupted even when less dangerous anomalous conditions (different from fault conditions) are present.

Of course, this fact may have a negative impact on the operative management of the LVDC electric power distribution network.

SUMMARY OF THE INVENTION

The main aim of the present invention is to provide a method and an electronic device for detecting ground faults in a LVDC electric line, which allow overcoming limitations of current solutions of the state of the art.

Within this aim, an object of the present invention is to provide a method and an electronic device, which allow detecting a differential current in a LVDC electric line and effectively discriminating whether said differential current is due to actual occurring fault conditions or to other less dangerous anomalous conditions.

Yet another object of the present invention is to provide a method and an electronic device that is relatively easy and cheap to implement at industrial level.

The present invention thus provides a method for detecting a differential current in a LVDC electric line, according to the following claim 1 and the related dependent claims.

In a further aspect, the present invention provides an electronic device for detecting a differential current in a LVDC electric line, according to the following claim 4 and the related dependent claims.

A further aspect of the invention relate to an electronic arrangement for LVDC electric power distribution networks, according to the following claim 12. Said electronic arrangement may be, for example, a protection device, a relay or the like.

Yet a further aspect of the invention relates to a switching device for LVDC electric power distribution networks according to the following claim 13. Said switching device may be, for example, a circuit breaker or a similar device (e.g. a disconnector, a recloser or the like) provided that it has a suitable breaking capacity.

BRIEF DESCRIPTION OF THE DRAWINGS

Characteristics and advantages of the invention will emerge from the description of preferred, but not exclusive, embodiments of the method and electronic device, according to the invention, non-limiting examples of which are provided in the attached drawings, wherein.

DETAILED DESCRIPTION OF EMBODIMENTS OF THE INVENTION

Referring to the cited figures, the present invention is related to a method 100 and an electronic device 1 for the detection of ground faults in a LVDC electric line 500 of a LVDC electric power distribution network 400.

The LVDC electric power distribution network 400 may be of known type and it may be configured according to the needs. As an example, it may be of unipolar type and include an earthing system of the TT type.

Figure 2:
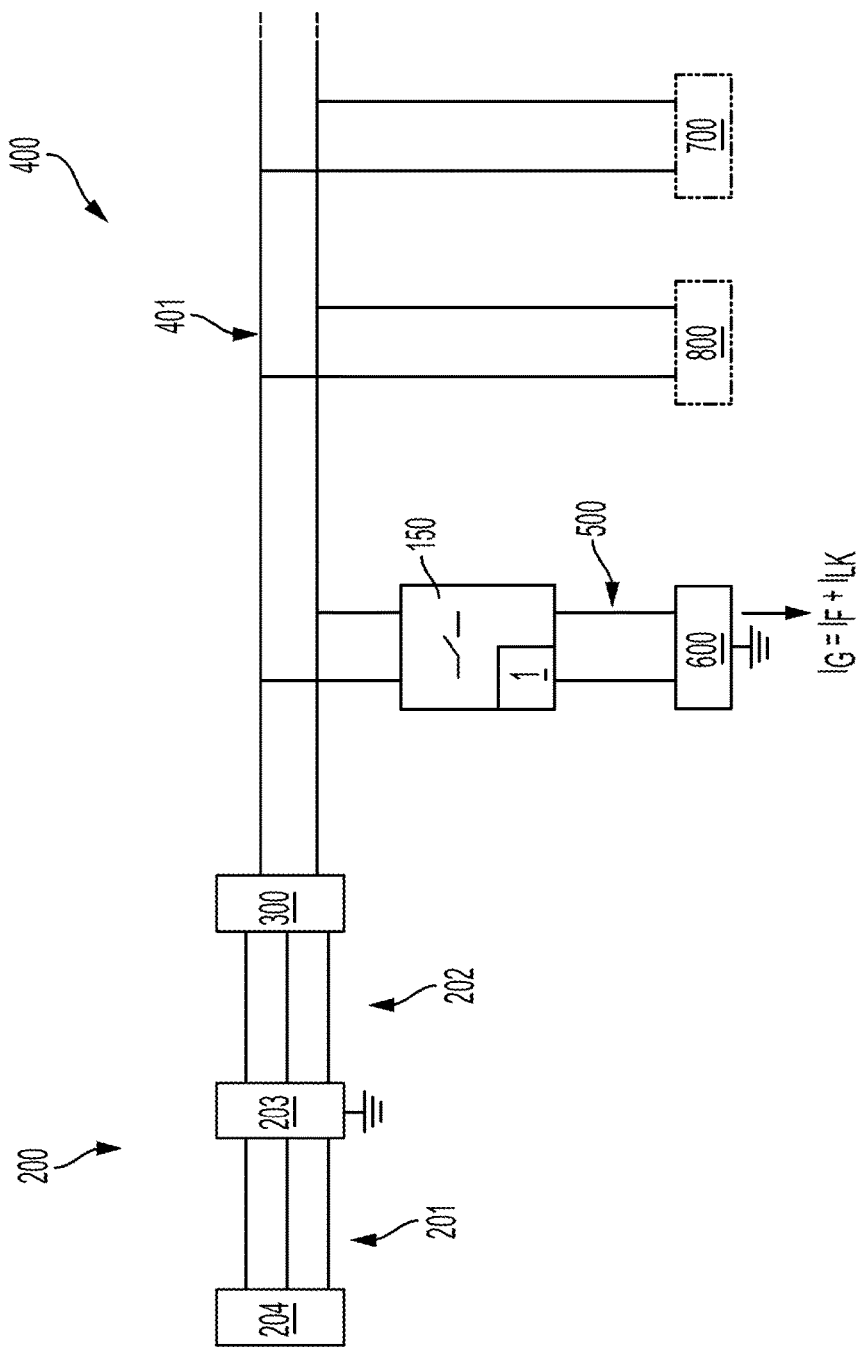
FIG. 2 schematically shows a LVDC electric power distribution network including the electronic device, according to the invention.

In FIG. 2, the LVDC electric power distribution network 400 is configured as a grid comprising a main power distribution line 401, to which electric loads 600, DG systems 700 or energy storage systems 800 may be electrically connected by means of suitable electric lines.

The LVDC electric power distribution network 400 comprises a front-end AC/DC conversion stage 300, which is electrically coupled to the main power distribution line 401 to feed this latter and the other electric lines electrically connected thereto.

The AC/DC conversion stage 300 may be of known type.

The AC/DC conversion stage 300 comprises a switching section including commutation devices having a given switching frequency $f_{SW}$.

Advantageously, the front-end conversion stage 300 is electrically coupled to an AC electric power distribution network 200.

The AC electric power distribution network 200 may be of known type and it may be configured according to the needs.

The AC electric power distribution network 200 may comprise a MV section 201, which is electrically connected between a MV power generation utility 204 and a MV/LV transformer stage 203, and a LV section 202, which is electrically connected between the MV/LV transformer stage 203 and the AC/DC conversion stage 300.

Preferably, the MV/LV transformer stage 203 is connected to ground for safety reasons, e.g. to prevent overvoltages.

The LVDC electric line 500 may be of known type and it may be configured according to the needs. For example it may be of unipolar or bipolar type.

The LVDC electric line 500 comprises a plurality of conductors forming the line cables.

The LVDC electric line 500 may be electrically connected to an electric load 600.

Figure 1A:
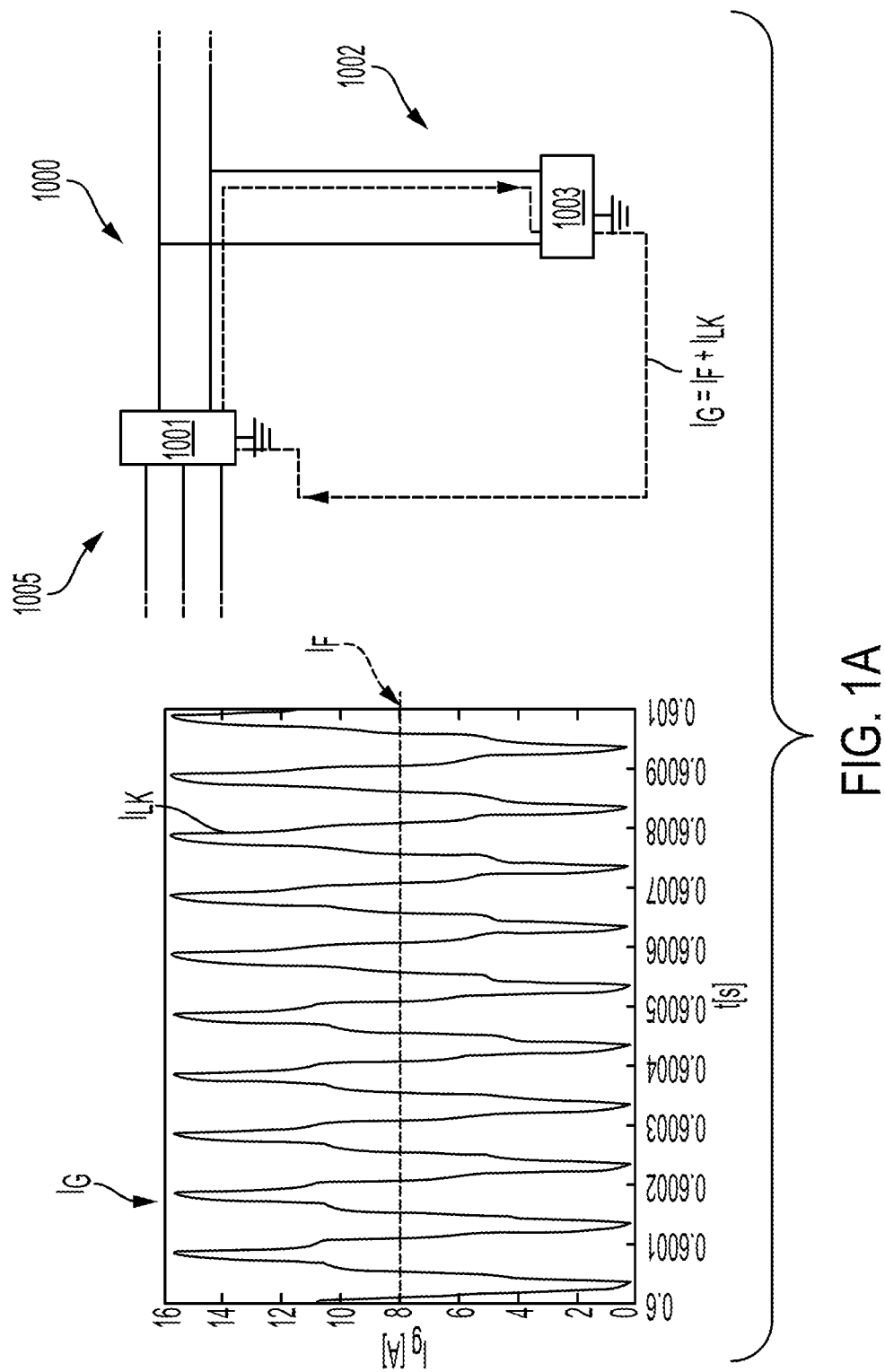
FIGS. 1A, 1B, 1C schematically show the operation of a generic LVDC electric power distribution network in normal conditions and when a fault event is present.
Figure 1B:
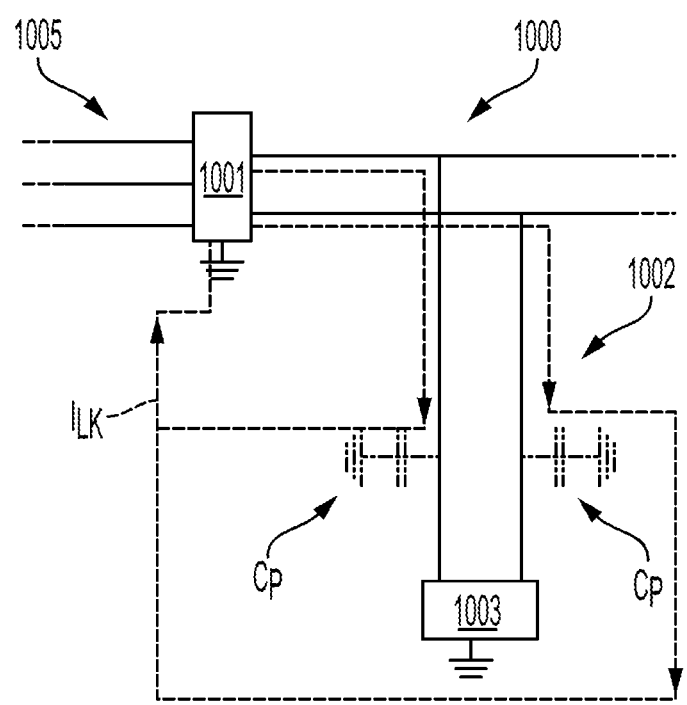
Figure 1C:
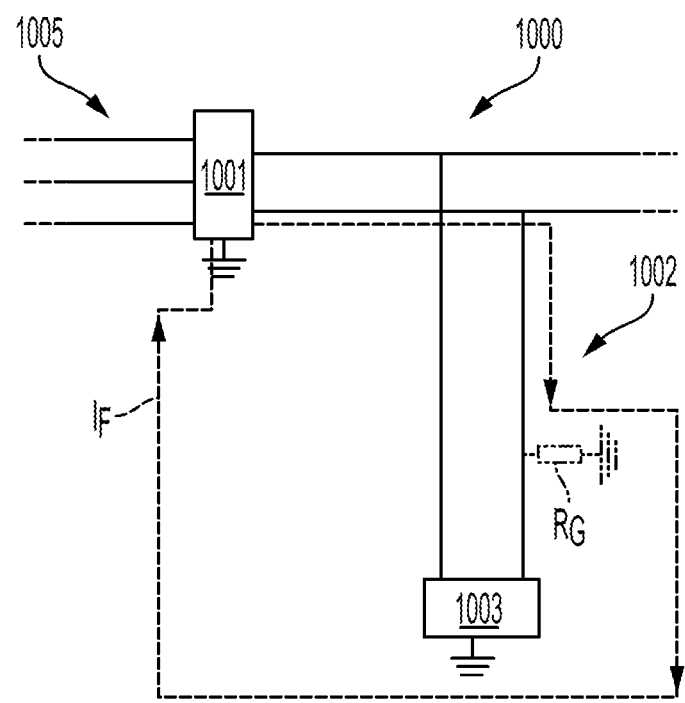

As an example, in FIG. 1, the LVDC electric line 500 is shown as electrically connecting an electric load 600 (having a connection to ground) with the main power distribution line 401 of the LVDC electric power distribution network 400.

In principle, however, the LVDC electric line 500 may be differently configured.

For example, it may be an electric line providing an electrical connection with a power generation unit (e.g. a DG unit or an energy storage unit).

The LVDC electric power distribution network 400 may comprise one or more switching devices 150, e.g. for ground fault protection purposes.

Figure 3:
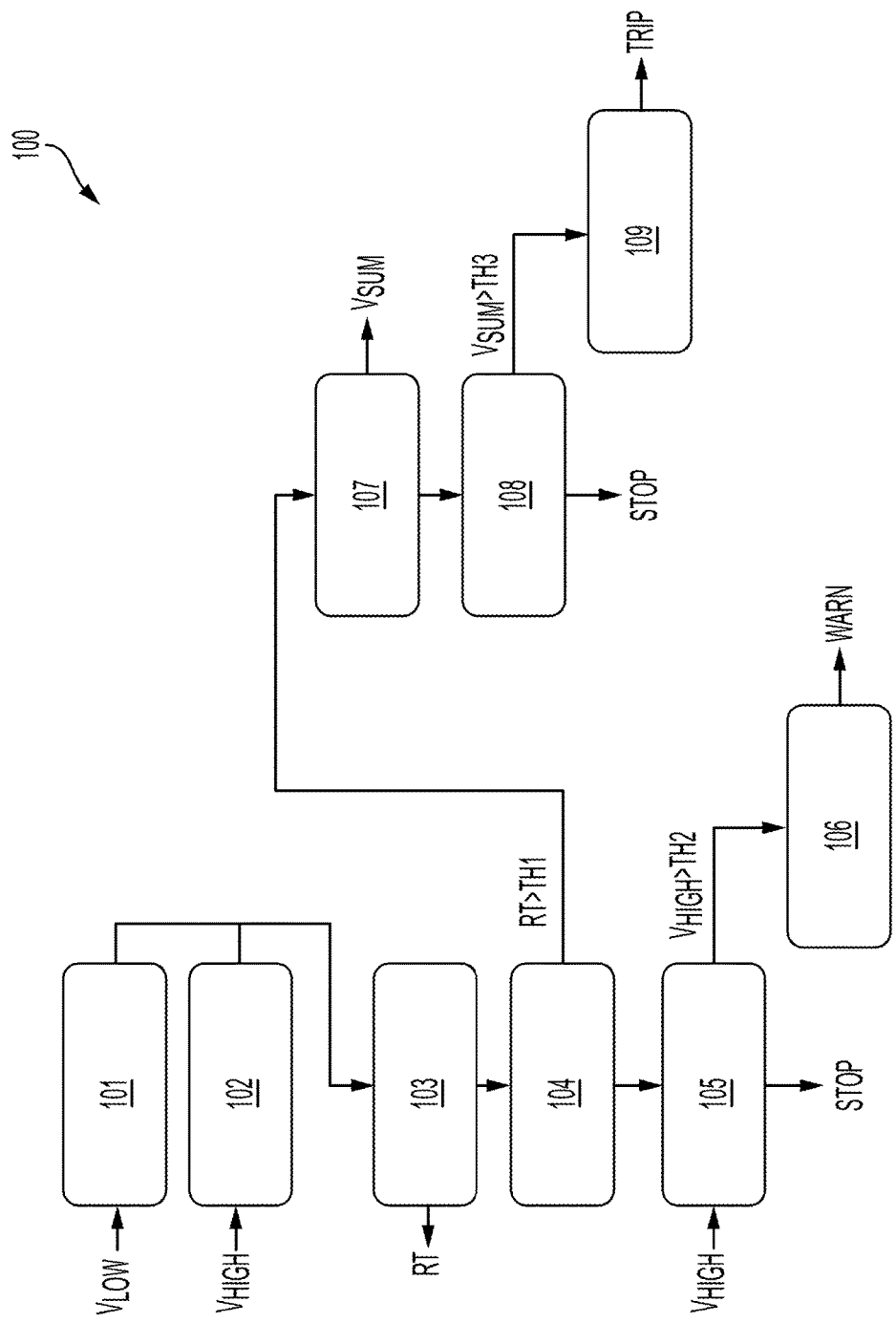
FIG. 3 schematically shows the method, according to the invention.

As mentioned above, according to one of its aspects, the present invention relates to a method 100 for the detection of faults in a LVDC electric line 500 of the LVDC electric power distribution network 400 (FIG. 3).

The method 100 comprises a step 101 of acquiring a first detection signal Wow, which is indicative of low-frequency components of a detected unbalancing current $I_G$ between a plurality of conductors of the electric line 500, and a step 102 of acquiring a second detection signal $V_{HIGH}$ indicative of high-frequency components of the detected unbalancing current $I_G$. For the sake of clarity, it is specified that in the following the terms "low-frequency components" and "high-frequency components" of the unbalancing current $I_G$ respectively identify the components of the unbalancing current $I_G$, which have a frequency respectively lower and higher than a reference frequency $f_E$, which is set depending on the configuration of the AC/DC conversion stage 300 and of the configuration of sensing means 2 adopted to detect the unbalancing current $I_G$.

Preferably, such a reference frequency $f_E$ is comprised in a frequency interval between 0 (DC) and $f_{SW}$, where $f_{SW}$ is the switching frequency of the AC/DC conversion stage 300.

Preferably, the frequency $f_E$ is much lower (e.g. at least 50% lower) than the switching frequency $f_{SW}$. As an example, if the switching frequency $f_{SW}$ is set at 10 KHz, the frequency $f_E$ has preferably values between 1 KHz and 5 KHz.

The first and second detection signals $V_{Low}$, $V_{HIGH}$ are respectively obtained by low-pass filtering and high-pass filtering of one or more corresponding measuring signals $V_{M1}$, $V_{M2}$ indicative of the unbalancing current $I_G$.

Preferably, the first and second detection signals Wow, $V_{HIGH}$ are respectively obtained by means of a low-pass filtering and a high-pass filtering of first and second measuring signals $V_{M1}$, $V_{M2}$ indicative of the unbalancing current $I_G$.

As it will be illustrated in the following, in the practical implementation of the method 100, the unbalancing current $I_G$ may be detected by suitably configured sensing means 2 operatively coupled with the conductors of the electric line 500 and configured to provide the one or more measuring signals $V_{M1}$, $V_{M2}$ indicative of the unbalancing current $I_G$.

Preferably, the measuring signals $V_{M1}$, $V_{M2}$ are AC signals at the reference frequency $f_E$. They may include high frequency components and possibly a DC component.

As it will be illustrated in the following, in the practical implementation of the method 100, the detection signals $V_{LOW}$, $V_{HIGH}$ may be provided by suitably configured filtering means 3 operatively associated with the sensing means 2 to receive the above mentioned measuring signals $V_{M1}$, $V_{M2}$.

Preferably, the detection signals $V_{LOW}$, $V_{HIGH}$ are voltage signals.

The method 100 comprises a step 103 of calculating a third detection signal RT by calculating the ratio between said first and second detection signals $V_{LOW}$, $V_{HIGH}$.

As it is equal to the ratio between the detection signal Wow and the detection signal $V_{HIGH}$, the detection signal RT provides information on whether the detected unbalancing current $I_G$ is also due to the contribution of a DC fault current $I_F$ towards ground or is due to sole high-frequency leakage currents $I_{LK}$ circulating towards ground.

In practice, the detection signal RT provides information, which allows excluding the presence of a DC fault current $I_F$, indicative of a ground fault event.

The method 100 thus comprises a step 104 checking whether a DC fault current $I_F$ is present by comparing the third detection signal RT with a first threshold value TH1.

Preferably, the first threshold value TH1 is set to zero (TH1=0).

However, the first threshold value TH1 may be set to a value in the neighborhood of zero, for example a value much smaller (i.e. at least an order of magnitude smaller) with respect to the typical amplitude values of possible DC fault currents $I_F$ towards ground in a LVDC grid.

A detection signal RT having a null or negligible amplitude (RT<=TH1) indicates that a fault current $I_F$ is not present and that the unbalancing current $I_G$ is basically due to high-frequency leakage currents $I_{LK}$ flowing towards ground.

On the other hand, a detection signal RT having a non-negligible amplitude (RT>TH1) indicates that a fault current $I_F$ is present, even if this latter may be overlapped with high-frequency leakage currents $I_{LK}$.

It is evident that the method 100 provides the information needed to ensure a good management of the operation of the electric line 500 and, more in general, of the LVDC electric power distribution network 400.

The method 100 provides, in fact, effective discrimination criteria to check whether the detected unbalancing current $I_G$ among the conductors of the electric line 500 is due to an actual fault event (DC fault current $I_F$) or is merely due to the sole presence of leakage currents $I_{LK}$ generated by the conversion stage 300.

Such discrimination criteria, which are basically implemented by the processing steps 103-104, allow excluding whether a fault current $I_F$ towards ground is present.

The method 100 therefore allows correctly addressing possible protection interventions on the electric line 500, thereby avoiding wrong or undesired interruptions of this latter.

If the presence of a Dc fault current $I_F$ is excluded by executing the step 103 illustrated above, the method 100 provides for processing the second detection signal $V_{HIGH}$ to check whether presence of the leakage currents $I_{LK}$ may be considered as a negligible phenomenon or requires a maintenance intervention (e.g. on the conversion stage 300).

Preferably, the method 100 comprises a step 105 of comparing the second detection signal $V_{HIGH}$ with a second threshold value TH2, if the third detection signal RT does not exceed the first threshold value TH1.

Preferably, the second threshold value TH2 is set according to the safety requirements for the operation of the electric line 500.

Preferably, the method 100 comprises a step 106 of generating an alarm signal WARN indicative of the presence of the leakage current $I_{LK}$ towards ground, if the second detection signal $V_{HIGH}$ exceeds the second threshold value TH2. In this case, anomalous operating conditions (possibly requiring a maintenance intervention) are signalled.

Advantageously, the alarm signal WARN may be sent to a relay or control until provided with suitable signalling means.

Preferably, the method 100 is terminated if the second detection signal $V_{HIGH}$ does not exceed the second threshold value TH2. In this case, the presence of the leakage currents $I_{LK}$ is not considered as an anomalous operating condition.

If the presence of a DC fault current $I_F$ is ascertained by executing the step 103 illustrated above, the method 100 provides for processing the detection signals $V_{Low}$, $V_{HIGH}$ to check whether an interruption of the electric line is needed for safety reasons.

Preferably, the method 100 comprises a step 107 of obtaining a fourth detection signal $V_{SUM}$ by calculating the sum of the first and second detection signals Wow, $V_{HIGH}$, if the third detection signal RT exceeds the first threshold value TH1.

The fourth detection signal $V_{SUM}$ is advantageously indicative of the overall magnitude of the currents flowing towards ground in the electric line 500. It thus provides the information needed to determine whether a protection intervention is needed.

Preferably, the method 100 comprises a step 108 of comparing the fourth detection signal $V_{SUM}$ with a third threshold value TH3.

Preferably, the third threshold value TH3 is set according to the safety requirements for the operation of the electric line 500.

The third threshold value TH3 may be set equal to the second threshold value TH2 (TH1=TH2).

Preferably, the method 100 comprises a step 109 of generating a trip signal TRIP to command the interruption of the electric line 500, if the fourth detection signal $V_{SUM}$ exceeds the third threshold value TH3.

Advantageously, the trip signal TRIP may be sent to a relay or control until of a switching device 150, which in turns provides for the interruption of the electric line 500.

The execution of the steps 107-109 described above provides relevant advantages from the safety point of view.

A possible protection intervention is commanded on the base of the peak amplitude of the fourth detection signal $V_{SUM}$, which is indicative of the overall magnitude of the currents flowing towards ground.

This ensures improved performances in terms of user's safety with respect to traditional protection devices, in which the amplitude of the sole DC fault current $I_F$ is checked for commanding a protection intervention.

As it will be illustrated in the following, in its practical implementation, the method 100 may be executed by suitably configured processing means 4, which may be of analog and/or digital type.

The signals $V_{LOW}$, $V_{HIGH}$, RT, $V_{HIGH}$, WARN, TRIP processed or provided in the method 100 may thus be analog signals or digital signals depending on the practical implementation of the method itself.

Figure 4:
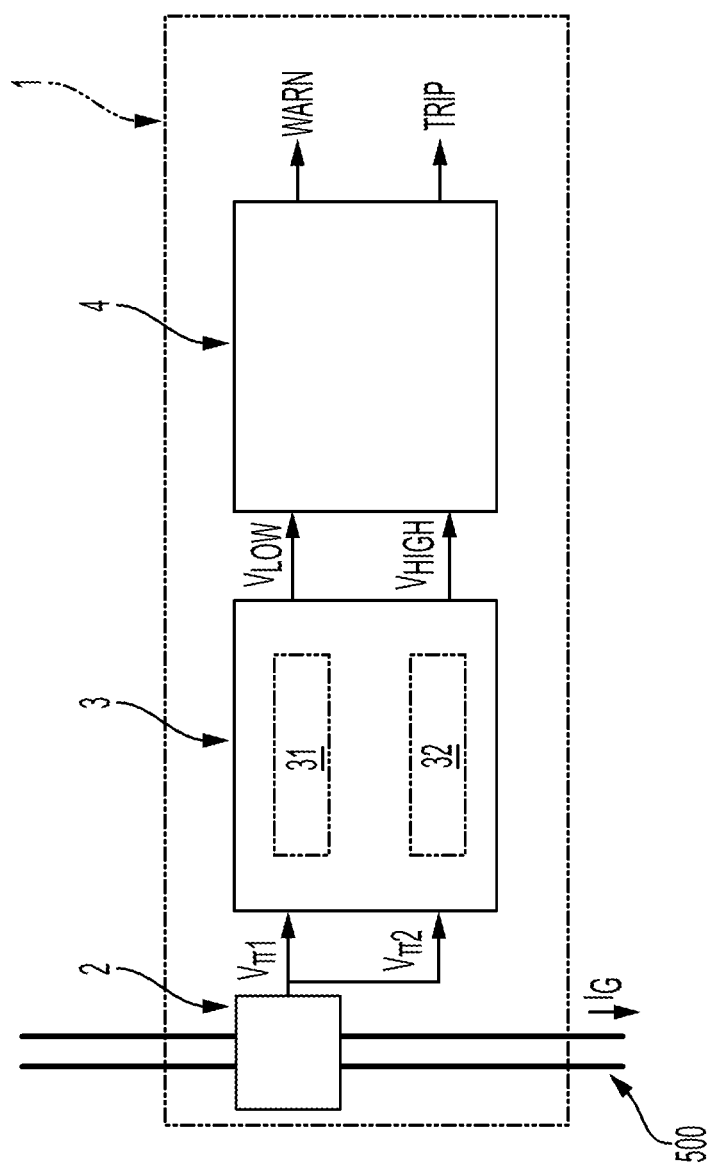
FIG. 4 schematically shows the electronic device, according to the invention.

As mentioned above, according to one of its aspects, the present invention relates to an electronic device 1 for the detection of ground faults in a LVDC electric line 500 of a LVDC electric power distribution network 400 (FIG. 4).

The electronic device 1 comprises sensing means 2 operatively coupled with the conductors of the electric line 500.

The sensing means 2 are adapted to provide one or more measuring signals $V_{M1}$, $V_{M2}$ indicative of an unbalancing current $I_G$ between the conductors of the electric line 500.

Preferably, the one or more measuring signals $V_{M1}$, $V_{M2}$ are AC signals at the reference frequency $f_E$, mentioned above. The measuring signals $V_{M1}$, $V_{M2}$ may have a harmonic content indicative high-frequency and of low-frequency components of an unbalancing current $I_G$.

Preferably, the one or more measuring signals $V_{M1}$, $V_{M2}$ are voltage signals.

The electronic device 1 comprises filtering means 3 configured to process the one or more measuring signals $V_{M1}$, $V_{M2}$ and provide a first detection signal $V_{LOW}$ indicative of low-frequency components of the unbalancing current $I_G$ and a second detection signal $V_{HIGH}$ indicative of high-frequency components of the unbalancing current $I_G$.

As already indicated above, the terms "low-frequency components" and "high-frequency components" of the unbalancing current $I_G$ should be intended as identifying the components of unbalancing current $I_G$, which have a frequency respectively lower and higher than the reference frequency $f_E$.

The filtering means 3 may of analog or digital type.

If they are implemented in analog manner, the filtering means 3 comprise electronic circuits suitably arranged to provide the filtering of the one or more measuring signals $V_{M1}$, $V_{M2}$. If they are implemented in a digital manner, the filtering means 3 comprise one or more computerised resources (e.g. microprocessors) configured to execute software instructions (storable in a medium) in order to carry out the filtering of the measuring signals $V_{M1}$, $V_{M2}$. The electronic device 1 comprises processing means 4 configured to process the first and second detection signals $V_{LOW}$, $V_{HIGH}$.

The processing means are configured to execute the method 100 described above and in FIG. 3.

As already indicated above, the processing means 4 may of analog or digital type.

If they are implemented in analog manner, the processing means 4 comprise electronic circuits suitably arranged to carry out the signal processing steps provided by the method 100. If they are implemented in a digital manner, the processing means 4 comprise one or more computerised units (e.g. microprocessors) configured to execute software instructions (storable in a medium) to carry out the signal processing steps provided by the method 100. Advantageously, the filtering means 3 and the processing means 4 may be integrated in one or more processing units, which may be of analog or digital type.

The electronic device 1 may comprise autonomous processing resources (e.g. it may be provided with an own microcontroller) to implement the processing means 4 or it may share processing resources that are present in the device, device or system, in which it is possibly embedded or integrated.

Figure 5:
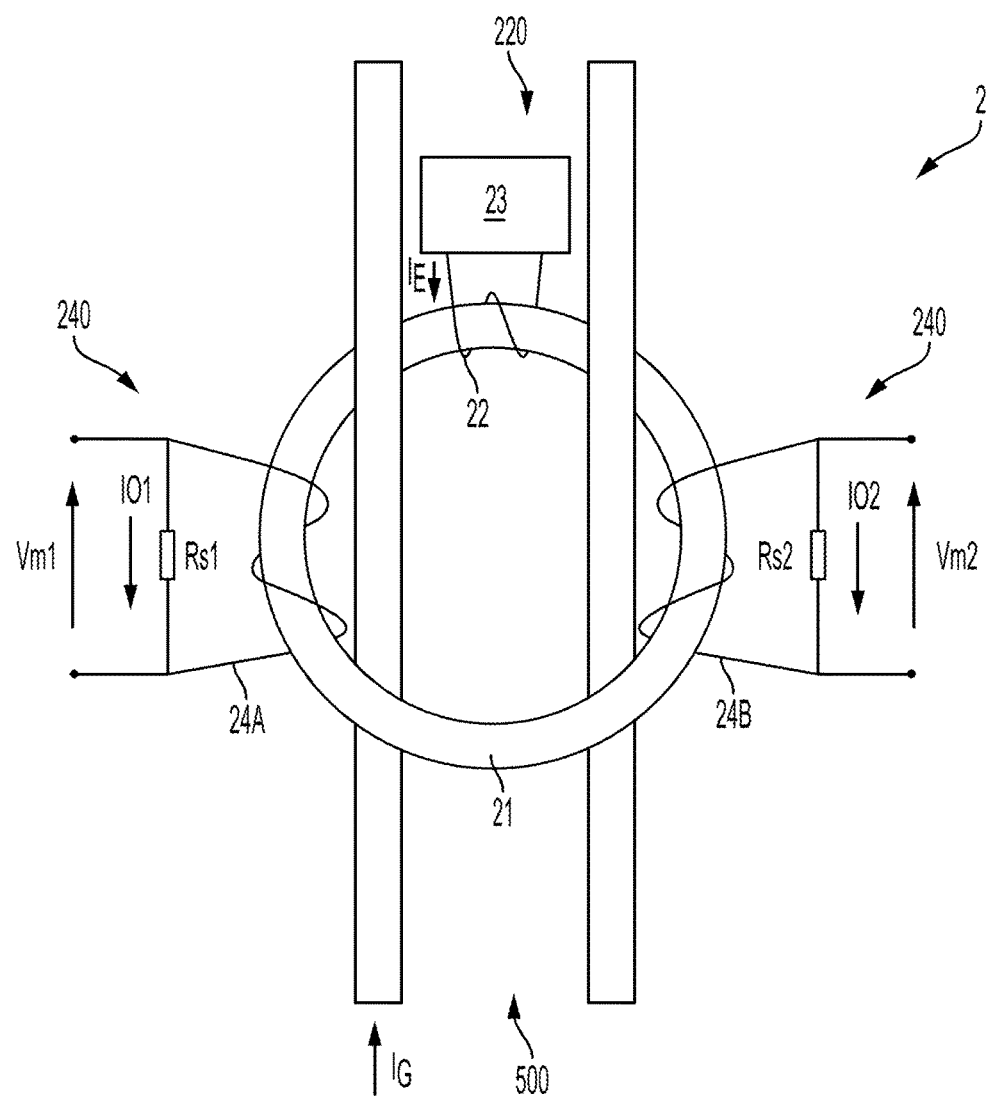
FIGS. 5-6 schematically show some parts of the electronic device of the invention, according to different embodiments thereof.
Figure 6:
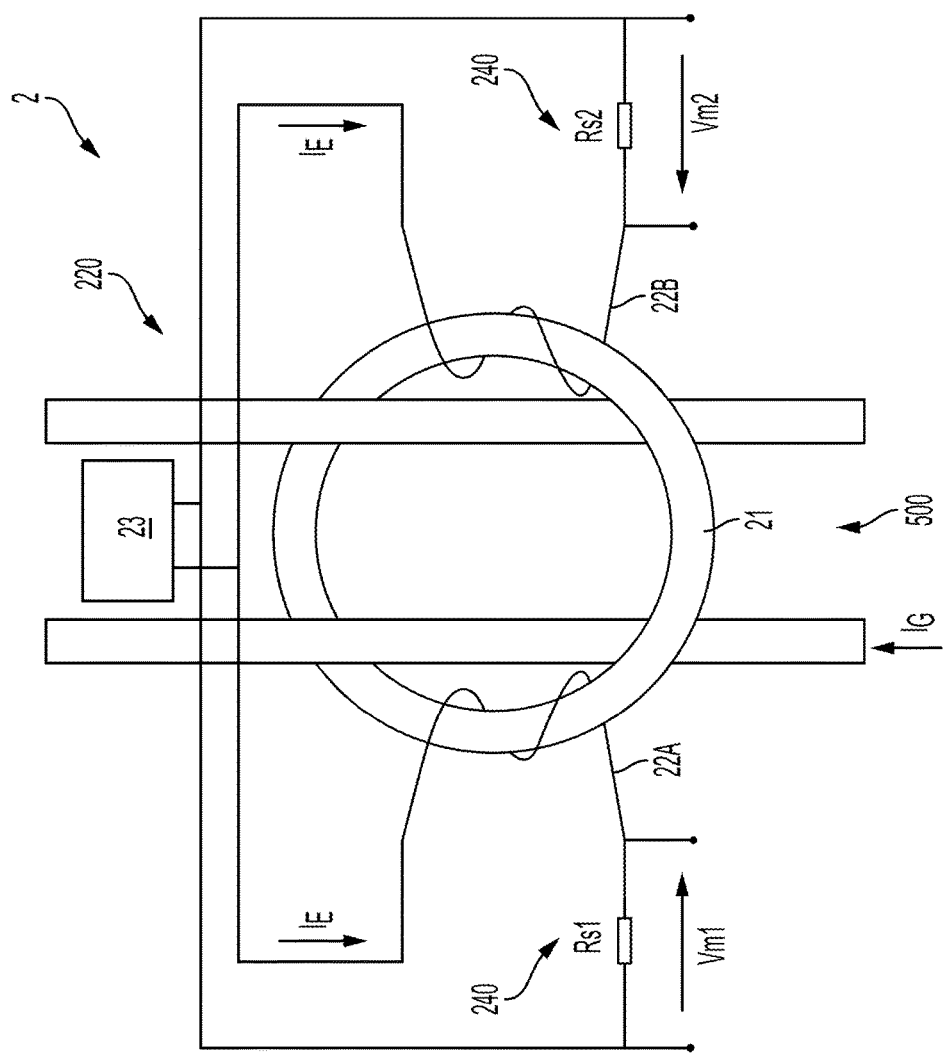

According to some embodiments of the invention (shown in FIGS. 4-6), the sensing means 2 are adapted to provide distinct first and second measuring signals $V_{M1}$, $V_{M2}$ indicative of the unbalancing current $I_G$.

In this case, the filtering means 3 are advantageously configured to process the first and second measuring signals $V_{M1}$, $V_{M2}$ and provide the detection signals $V_{Low}$, $V_{HIGH}$.

Preferably, the filtering means 3 comprise first low-pass filtering means 31 configured to process the first measuring signal $V_{M1}$ and provide the first detection signals $V_{Low}$.

Preferably, the filtering means 3 comprise second high-pass filtering means 32 configured to process the second measuring signal $V_{M2}$ and provide the second detection signals $V_{HIGH}$.

According to other embodiments of the invention (not shown), the sensing means 2 may be adapted to provide a sole measuring signal indicative of the unbalancing current $I_G$.

In this case, the filtering means 3 are advantageously configured to process such a measuring signal and provide the detection signals $V_{LOW}$, $V_{HIGH}$.

Preferably, the sensing means 2 comprise at least a magnetic core 21 configured to form a magnetic flux path enchained with the conductors of the electric line 500.

Advantageously, the magnetic core 21 has a high magnetic permeability and it may be made, for example, of a Ni—Fe alloy.

Preferably, the magnetic core 21 is shaped as a toroid.

The magnetic core 21 is advantageously arranged to sense unbalancing currents $I_G$ among the conductors of the electric line 500.

In order to increase the overall sensitivity to possible unbalancing currents $I_G$ in the electric line 500, the conductors of the electric line 500 may be wound around the magnetic core 21 to form multiple turns.

Preferably, the sensing means 2 comprise an excitation circuit section 220 operatively coupled with the magnetic core 21.

The excitation circuit section 220 comprises one or more excitation windings 22, 22A, 22B wound around the magnetic core 21 and at least a power source 23 electrically connected to said excitation windings.

The power source 23 provides an excitation current $I_E$, which circulates along the excitation windings 22, 22A, 22B.

The excitation current $I_E$ is an AC current having a frequency $f_E$, which constitutes the reference frequency for discriminating between the low-frequency and high-frequency components of the unbalancing current $I_G$.

As described above, the frequency $f_E$ is comprised in the interval $0 < f_E < f_{SW}$, where $f_{SW}$ is the switching frequency of a conversion stage 300 feeding the electric line 500.

The frequency $f_E$ is thus advantageously set depending on the switching frequency $f_{SW}$ of the conversion stage 300, which feeds the electric line 500.

The power source 23 may advantageously be of the known type, e.g. an electronic oscillator circuit.

Preferably, the sensing means 2 comprise an output circuit section 240, which is operatively associated with the excitation circuit section 220 to provide the measuring signals $V_{M1}$, $V_{M2}$ indicative of the unbalancing currents $I_G$.

According to some embodiments of the invention, the output circuit section 240 comprises one or more detection windings 24A, 24B wound around the magnetic core 21.

The output circuit section 240 further comprises one or more resistive shunts $R_{si}$, $R_{S2}$, each of which is electrically connected to a corresponding detection winding 24A, 24B.

Each detection element $R_{si}$, $R_{S2}$ is adapted to detect a corresponding detection current $I_{O1}$, $I_{O2}$ flowing along the corresponding detection winding 24A, 24B and provide a corresponding measuring signal $V_{M1}$, $V_{M2}$ indicative of the unbalancing currents $I_G$.

According to an embodiment of the invention (shown in FIG. 5), the sensing means 2 comprises the magnetic core 21 and an excitation circuit section 220, which comprises a sole excitation winding 22 wound around the magnetic core 21 and the power source 23, which is electrically connected to the excitation winding 22 to provide an excitation current $I_E$ flowing along this latter.

According to such an embodiment, the sensing means 2 comprises an output circuit section 240, which comprises a first detection winding 24A wound around the magnetic core 21 and a first detection element $R_{S1}$ electrically connected to the first detection winding 24A and which comprises a second detection winding 24B wound around the magnetic core 21 and a second detection element $R_{S2}$ electrically connected to the second detection winding 24B.

Preferably, the first and second detection elements $R_{S1}$, $R_{S2}$ comprise shunt resistors, each of which is electrically connected in series with the corresponding detection winding 24A, 24B.

The power source 23 provides the excitation current $I_E$, which polarizes the magnetic core 21 at a given operating point, e.g. at an operating point in which the magnetic permeability shows a strong transition towards small values, namely at an operating point located close to a positive or negative saturation region of the hysteresis loop of the magnetic core 21.

As a consequence of the circulation of the excitation current $I_E$, first and second detection currents $I_{O1}$, $I_{O2}$ (having an amplitude proportional to the excitation current $I_E$ and to possible leakage currents $I_{LK}$ and/or DC current $I_F$) circulate respectively along the first and second detection windings 24A, 24B (and preferably along the first and second detection elements $R_{S1}$, $R_{S2}$).

Depending on the design of the detection windings 24A, 24B and of the detection elements $R_{S1}$, $R_{S2}$, the detection currents $I_{O1}$, $I_{O2}$ may be identical or different, according to the needs. The first detection element $R_{S1}$ detects a first detection current $I_{O1}$ flowing along the first detection winding 24A and provides a first measuring signal $V_{M1}$.

The second detection element $R_{S2}$ detects a second detection current $I_{O2}$ flowing along the second detection winding 24B and provides a second measuring signal $V_{M2}$.

The first and second voltage measuring signals $V_{M1}$, $V_{M2}$ are indicative of an unbalancing current $I_G$ between the conductors of the electric line 500.

Preferably, the first and second voltage measuring signals $V_{M1}$, $V_{M2}$ are voltage signals generated by the corresponding shunt resistors $R_{S1}$, $R_{S2}$ when the corresponding detection currents $I_{O1}$, $I_{O2}$ flow along said shunt resistors. The measuring signals $V_{M1}$, $V_{M2}$ can thus be taken at the terminals of the shunt resistors $R_{S1}$, $R_{S2}$.

As mentioned above, the measuring signals $V_{M1}$, $V_{M2}$ are AC signals at the frequency $f_E$ and may have a harmonic content indicative of possible high-frequency and low-frequency components of the unbalancing current $I_G$.

Depending on the design of the detection windings 24A, 24B and of the detection elements $R_{S1}$, $R_{S2}$, the measuring signals $V_{M1}$, $V_{M2}$ may be identical or different, according to the needs. According to a possible variant (not shown) of the embodiment shown in FIG. 5, the sensing means 2 comprises an output circuit section, which comprises a sole detection winding and a corresponding detection element electrically connected to said detection winding.

In this case, the sensing means 2 provide a sole measuring signal indicative of the unbalancing current $I_G$, which is received by the filtering means 3 that process it to provide the first and second detection signals $V_{LOW}$, $V_{HIGH}$.

According to further embodiments of the invention, the output circuit section 240 comprises one or more resistive shunts $R_{S1}$, $R_{S2}$, each of which is electrically connected to a corresponding excitation winding 22A, 22B.

Each detection element $R_{S1}$, $R_{S2}$ is adapted to detect the excitation current $I_E$ flowing along the corresponding excitation winding and provide a corresponding measuring signal $V_{M1}$, $V_{M2}$.

According to an embodiment of the invention (shown in FIG. 6), the sensing means 2 comprises the magnetic core 21 and an excitation circuit section 220, which comprises first and second excitation windings 22A, 22B wound around the magnetic core 21 and the power source 23, which is electrically connected to the excitation windings 22A, 22B to provide an excitation current $I_E$ flowing along these latter.

According to such an embodiment, the sensing means 2 comprises an output circuit section, which comprises a first detection element $R_{S1}$ electrically connected to the first excitation winding 22A and which comprises a second detection element $R_{S2}$ electrically connected to the second excitation winding 22B.

Preferably, the first and second detection elements $R_{S1}$, $R_{S2}$ comprise shunt resistors, each of which is electrically connected in series with the corresponding detection winding 24A, 24B.

Depending on the design of the detection elements $R_{S1}$, $R_{S2}$, the excitation currents $I_E$ provided by the voltage source 23 may be identical or different, according to the needs.

The power source 23 provides the excitation currents $I_E$, which polarize the magnetic core 21 at a given operating point.

The first detection element $R_{S1}$ detects the corresponding excitation current $I_E$ flowing along the first excitation winding 22A and provides a first measuring signal $V_{M1}$.

The second detection element $R_{S2}$ detects the corresponding excitation current $I_E$ flowing along the second excitation winding 22B and provides a second measuring signal $V_{M2}$.

The first and second voltage measuring signals $V_{M1}$, $V_{M2}$ are indicative of an unbalancing current $I_G$ between the conductors of the electric line 500.

Preferably, the first and second voltage measuring signals $V_{M1}$, $V_{M2}$ are voltage signals generated by the corresponding shunt resistors $R_{S1}$, $R_{S2}$ when the corresponding excitation currents $I_E$ flow along said shunt resistors. The measuring signals $V_{M1}$, $V_{M2}$ can thus be taken at the terminals of the shunt resistors $R_{S1}$, $R_{S2}$.

As mentioned above, the measuring signals $V_{M1}$, $V_{M2}$ are AC signals at the frequency $f_E$ and may have a harmonic content indicative of the low-frequency and high-frequency components of the unbalancing current $I_G$.

Depending on the design of the excitation windings 24A, 24B and of the detection elements $R_{S1}$, $R_{S2}$, the measuring signals $V_{M1}$, $V_{M2}$ may be identical or different, according to the needs. According to a possible variant (not shown) of the embodiment shown in FIG. 6, the sensing means 2 comprises an excitation circuit section, which comprises a sole excitation winding, and an output circuit section, which comprises a corresponding detection element electrically connected to said excitation winding.

In this case, the sensing means 2 provide a sole measuring signal indicative of the unbalancing current $I_G$, which is received by filtering means 3 that process it to provide the first and second detection signals $V_{LOW}$, $V_{HIGH}$.

As the skilled person will certainly understand, further arrangements for the sensing means 2 are possible.

For example, the sensing means 2 may comprise multiple sensing stages, each of which is provided with a corresponding magnetic core, a corresponding excitation circuit section and a corresponding output circuit section (which may be arranged according to one of the solutions illustrated above) to provide a corresponding measuring signal $V_{M1}$, $V_{M2}$ indicative of an unbalancing current $I_G$ between the conductors of the electric line 500.

As a further example, the sensing means 2 may comprise an excitation section having multiple power sources, each of which provides an excitation current $I_E$ to a corresponding excitation winding.

The method 100 and the electronic device 1 of the invention have a number of advantages. The method of the invention allows effectively discriminating whether a detected unbalancing current in an electric line 500 is due to occurring fault conditions or to other less dangerous anomalous conditions, such as the presence of leakage currents at the switching frequency of the AC/DC conversion stage 300 feeding the electric line 500.

This provides remarkable advantages in managing the operation of a LVDC electric power distribution networks as it helps to avoid undesired or wrong interruptions of the electric power distribution and it allows correcting addressing possible maintenance interventions.

Information on the low-frequency and high-frequency components of possible unbalancing currents $I_G$ is therefore conveniently exploited to ensure a longer operational service time of the electric line 500 or of the electric systems/apparatuses connected thereto.

As an example, a switching device 150 arranged to trip the electric line 500 and incorporating the electronic device 1 may be capable of remaining in a closed state for a longer time, thereby ensuring a prolonged operational service time of the electric line 500 and of the electric systems/apparatuses connected thereto, without jeopardizing safety.

The electronic device 1 can be easily embedded or integrated in many different LVDC applications.

As an example, the electronic device 1 can be easily used in RCDs (Residual Current Devices), relays, control devices and IEDs (Intelligent Electronic Devices—electronic microcontroller-based devices for managing operation of electric power equipment) for LVDC electric power distribution networks.

As a further example, the electronic device 1 can be embedded in a switching device 150, as shown in FIG. 2.

In this case, the electronic device 1 may be configured to send the alarm signal WARN and/or the trip signal TRIP may be sent to a relay or control until included or operatively associated with the switching device 150.

Information on the low-frequency and high-frequency components of possible unbalancing currents $I_G$ may be conveniently exploited to improve functionalities of electrical devices dedicated to the LVDC electric power distribution network, such as protection devices, switching devices, relays or the like.

As an example, a RCD incorporating the electronic device 1 can provide improved diagnostics functionalities, which may be suitably exploited to manage the operation of said protection device or for implementing advanced smart-grid management functionalities. In this last case, information provided by the electronic device 1 may be easily communicated directly or through a proper communication network to any device of the LVDC electric power distribution network in which the RCD is installed.

The electronic device 1 may also be used as stand-alone device and it can be easily put into communication with remote devices. In this case, the electronic device 1 is preferably provided with autonomous processing resources (e.g. a microcontroller).

The electronic device 1 is thus characterized by a high flexibility in use, which makes it suitable for use in any type of LVDC grid.

The electronic device 1 is easy and cheap to implement and/or manufacture at industrial level.

What we claim is:

1. A method for detecting faults in a LVDC electric line, the line having first and second conductors, the method comprising: passing an excitation current through an excitation winding, the excitation winding being wound around a magnetic core, the magnetic core being enchained with the first and second conductors of the electric line; acquiring a first detection signal indicative of low-frequency components of an unbalancing current (IG) between, comprising; sending a current through the first conductor; obtaining a first measuring signal (VM1) in response to the excitation current in the excitation winding;

low pass filtering the first measuring signal (VM1) to output a first detection signal (VLOW); acquiring a second detection signal (VHIGH) indicative of high-frequency components of said unbalancing current (IG), comprising; sending a current through the second conductor; obtaining a second measuring signal (VM) in response to the excitation current in the excitation winding; high pass filtering the second measuring signal (VM2) to output a second detection signal (VHIGH); obtaining a third detection signal (RT) by calculating the ratio between said first and second detection signals (VLOW, VHIGH); checking whether a DC current (IF) towards ground is present by comparing said third detection signal (RT) with a first threshold value (TH1) (highlighted for emphasis).

2. An electronic device for detecting faults in a LVDC electric line, the line having first and second conductors, the device comprising:

sensing means for providing at least a measuring signal (VM1, VM2) indicative of an unbalancing current (IG) between the conductors of said electric line;

filtering means for filtering the measuring signal (VM1, VM2) and providing a first detection signal (VLOW) indicative of low-frequency components of said unbalancing current and a second detection signal (VHIGH) indicative of high-frequency components of said unbalancing current;

processing means for processing said first and second detection signals (VLOW, VHIGH), said processing means being programmed to perform operations comprising:

obtaining a third detection signal (RT) by calculating the ratio between said first and second detection signals (VLOW, VHIGH); and checking whether a DC current (IF) towards ground is present by comparing said third detection signal (RT) with a first threshold value (TH1).

3. A device, according to claim 2, the operations further comprising, which comprises the following steps of: obtaining a fourth detection signal (VSUM) indicative of the an overall currents flowing towards ground by calculating the sum of said first and second detection signals (VLOW, VHIGH), if said third detection signal (RT) exceeds said first threshold value (TH1); comparing said fourth detection signal (VSUM) with a third threshold value (TH3); generating a trip signal (TRIP) to command the interruption of said electric line, if said fourth detection signal (VSUM) exceeds said third threshold value (TH3).

4. A device according to claim 2, the operations further comprising, which comprises the steps of: comparing said second detection signal (VHIGH) with a second threshold value (TH2), if said third detection signal (RT) does not exceed said first threshold value (TH1); generating an alarm signal (WARN) indicative of the presence of high-frequency leakage currents towards ground, if said second detection signal (VHIGH) exceeds said second threshold value (TH2).

5. An electronic device, according to claim 2, wherein said sensing means comprise at least a magnetic core configured to form a magnetic flux path enchained with the conductors of said electric line.

6. An electronic device, according to claim 5, wherein said sensing means comprise an excitation circuit section comprising at least an excitation winding wound around said magnetic core and at least a power source electrically connected to said excitation winding to provide an excitation current circulating along said excitation winding, said excitation current having a frequency (fE) comprised in the interval 0<fE<fsw, where fsw is the switching frequency of a AC/DC conversion stage feeding said electric line.

7. An electronic device, according to claim 6, wherein said sensing means comprise an output circuit section comprising at least a detection winding and at least a detection element (Rs1, Rs2) electrically connected with said detection winding, said detection element detecting at least a detection current (IO1, IO2) flowing along said detection winding and providing at least a measuring signal (VM1, VM2) indicative of said unbalancing current (IG).

8. An electronic device, according to the claim 5, wherein said sensing means comprise: said magnetic core; an excitation circuit section comprising an excitation winding wound around said magnetic core and a power source electrically connected to said excitation winding; an output circuit section comprising: a first detection winding wound around said magnetic core and a first detection element (Rs1) electrically connected with said first detection winding, said first detection element detecting a first detection current (Io1) flowing along said first detection winding and providing a first measuring signal (VM1) indicative of said unbalancing current (IG); a second detection winding wound around said magnetic core and a second detection element (Rs2) electrically connected with said second detection winding, said second detection winding detecting a second detection current (IO2) flowing along said second detection winding and providing a second measuring signal (VM2) indicative of said unbalancing current (IG).

9. An electronic device, according to claim 6, wherein said sensing means comprise an output circuit section comprising at least a detection element (Rs1, Rs2) electrically connected with said at least an excitation winding, said detection element detecting said excitation current (IE) flowing along said excitation winding and providing at least a measuring signal (VM1, VM2) indicative of said unbalancing current (IG).

10. An electronic device, according to claim 5, wherein said sensing means comprise: said magnetic core; an excitation circuit section comprising: a first excitation winding and a second excitation winding wound around said magnetic core; a power source electrically connected with said first and second excitation windings to provide said excitation current (IE) flowing along said first and second excitation windings; an output circuit section comprising: a first detection element (Rs1) electrically connected with said first excitation winding, said first detection element detecting said excitation current (IE) flowing along said first detection winding and providing a first measuring signal (VM1) indicative of said unbalancing current (IG); a second detection element (RS2) electrically connected with said second excitation winding, said second detection element detecting said excitation current (1E) flowing along said second detection winding and providing a second measuring signal (VM2) indicative of said unbalancing current (IG).

11. An electronic arrangement for LVDC electric power distribution networks which comprises an electronic device, according to claim 2.

12. A switching device for LVDC electric power distribution networks which comprises an electronic device, according to claim 2.

13. A device, according to claim 4, the operations further comprising: obtaining a fourth detection signal (VSUM) indicative of an overall currents flowing towards ground by calculating the sum of said first and second detection signals (VLOW, VHIGH), if said third detection signal (RT) exceeds said first threshold value (TH1); comparing said fourth detection signal (VSUM) with a third threshold value (TH3); generating a trip signal (TRIP) to command the interruption of said electric line, if said fourth detection signal (VSUM) exceeds said third threshold value (TH3).

14. An electronic device for detecting faults in a LVDC electric line, the line including first and second conductors; the device comprising: a magnetic core enchained with the first and second conductors of the electric line; an excitation circuit having an excitation winding wound around said magnetic core and configured to provide an excitation current along the excitation winding; a first sensor configured to send a current through the first conductor and provide a first measuring signal (VM1) in response to the excitation current in the excitation winding; a second sensor configured to send a current through the second conductor and provide second measuring signal (VM2) in response to the excitation current in the excitation winding; a filter configured to (a) low pass filter the first measuring signal (VM1) to output a first detection signal (VLOW) and (b) high pass filter the output a second measuring signal (VM2) to output a second detection signal (VHIGH); a processor programmed to perform operations comprising: calculating as third detection signal (RT) a ratio between the first and second detection signals (VLOW, VHIGH); and identifying a DC current (IF) towards ground in response the third detection signal (RT) exceeding a first threshold value (TH1).

15. The device of claim 14, where the operations further comprise: generating an alarm signal in response to a combination of (a) the third detection signal (RT) not exceeding a first threshold value (TH1) and (b) the second detection signal (VHIGH) exceeds a second threshold value (TH2).

16. The device of claim 14, where the operations further comprise: issuing a command to interrupt the electric line in response a sum of said first and second detection signals (VLOW, VHIGH) exceeding a third threshold value (TH3).

17. The device of claim 14, where the filter is at least one analog circuit filter, or at least one digital filter.

18. The device of claim 14, wherein the excitation current has a frequency (fE) within a range of 0<fE<fsw, where fsw is a switching frequency of an AC/DC conversion stage feeding said electric line.

19. The device of claim 14, wherein the first sensor includes a winding about the magnetic core and a resistive shunt, wherein the first measuring signal (VM1) is the voltage across the resistive shunt.

20. The device of claim 14, wherein the second sensor includes a winding about the magnetic core and a resistive shunt, wherein the first measuring signal (VM1) is the voltage across the resistive shunt.

21. A device according to claim 2, the operations further comprising: comparing said second detection signal (VHIGH) with a second threshold value (TH2), if said third detection signal (RT) does not exceed said first threshold value (TH1); generating an alarm signal (WARN) indicative of the presence of high-frequency leakage currents towards ground, if said second detection signal (VHIGH) exceeds said second threshold value (TH2).

22. A device, according to claim 2, the operations further comprising: obtaining a fourth detection signal (VSUM) indicative of an overall currents flowing towards ground by calculating the sum of said first and second detection signals (VLOW, VHIGH), if said third detection signal (RT) exceeds said first threshold value (TH1); comparing said fourth detection signal (VSUM) with a third threshold value (TH3); generating a trip signal (TRIP) to command the interruption of said electric line, if said fourth detection signal (VSUM) exceeds said third threshold value (TH3).

\* \* \* \* \*